(12) United States Patent
Hwang et al.

(10) Patent No.: US 11,891,718 B2
(45) Date of Patent: Feb. 6, 2024

(54) METHOD AND APPARATUS FOR GROWING SILICON SINGLE CRYSTAL INGOT

(71) Applicant: SK Siltron Co., LTD., Gyeongsangbuk-do (KR)

(72) Inventors: Hyun Ju Hwang, Gyeongsangbuk-do (KR); Sang Hee Kim, Gyeongsangbuk-do (KR); Kyung Tae Park, Gyeongsangbuk-do (KR)

(73) Assignee: SK SILTRON CO., LTD., Gyeongsangbuk-do (KR)

(*) Notice: Subject to any disclaimer, the term of this patent is extended or adjusted under 35 U.S.C. 154(b) by 28 days.

(21) Appl. No.: 17/578,573

(22) Filed: Jan. 19, 2022

(65) Prior Publication Data

US 2022/0251724 A1  Aug. 11, 2022

(30) Foreign Application Priority Data

Feb. 9, 2021  (KR) .................. 10-2021-0018275

(51) Int. Cl.
*C30B 15/22* (2006.01)
*C30B 29/06* (2006.01)
*C30B 15/10* (2006.01)
*C30B 15/14* (2006.01)
*C30B 15/36* (2006.01)

(52) U.S. Cl.
CPC .............. *C30B 15/22* (2013.01); *C30B 15/10* (2013.01); *C30B 15/14* (2013.01); *C30B 15/36* (2013.01); *C30B 29/06* (2013.01)

(58) Field of Classification Search
CPC ......... C30B 15/10; C30B 15/14; C30B 15/22; C30B 15/36; C30B 29/06
See application file for complete search history.

(56) References Cited

FOREIGN PATENT DOCUMENTS

| KR | 101565674 B1 | * 10/2015 | ............. C30B 15/20 |
| KR | 10-1565674 | 11/2015 | |
| KR | 10-2019-0100653 A | 8/2019 | |

OTHER PUBLICATIONS

European Patent Office, English computer translation of KR10-1565674 (Year: 2023).*
Korean Office Action dated Jun. 29, 2023 issued in Application 10-2021-0018275.

* cited by examiner

*Primary Examiner* — Matthew J Song
(74) *Attorney, Agent, or Firm* — KED & ASSOCIATES, LLP

(57) ABSTRACT

Embodiments provide a method of growing a silicon single crystal ingot, the method including growing a silicon single crystal ingot having crystal orientation of (111) using the Czochralski method, measuring a diameter of the silicon single crystal ingot, calculating a length of a facet of the silicon single crystal ingot, calculating a correction formula for a rotation speed of a seed and a correction formula for a pulling speed of the silicon single crystal ingot based on the calculated facet length, and correcting the rotation speed of the seed and the pulling speed of the silicon single crystal ingot based on a result of the calculation.

6 Claims, 4 Drawing Sheets

(100) Crystal (100) Crystal (110) Crystal (111) Crystal

| Region | D | C | B | A |
|---|---|---|---|---|
| Facet Length (cm) | 5(seed) ~ 6.5(tail) | 3 (Facet generated) | Flower generated | 6.5 ~ 8.5 |
| Diameter shortfall | △ | X | ○ (not usable) | △ |

METHOD AND APPARATUS FOR GROWING SILICON SINGLE CRYSTAL INGOT

This application claims the benefit of Korean Patent Application No. 10-2021-0018275, filed on Feb. 9, 2021, which is hereby incorporated by reference as if fully set forth herein.

BACKGROUND OF THE INVENTION

Field of the Invention

Embodiments relate to growth of a silicon single crystal ingot, and more particularly, the embodiments are intended to control a difference between a facet length and a target diameter that occurs while growing a silicon single crystal ingot having crystal orientation of (111).

Discussion of the Related Art

A general silicon wafer is manufactured through processes of growing a silicon single crystal to prepare a single crystal (ingot), slicing the single crystal to obtain thin disk-shaped wafers, lapping the wafer to remove damage remaining on the wafer due to mechanical processing of the slicing, polishing the wafer, and cleaning to mirror-polish the polished wafer and remove abrasives or foreign substances attached to the wafer.

In the process of growing the silicon single crystal among the above processes, the silicon single crystal may be grown by the Czochralski method (hereinafter referred to as the 'CZ' method) or the like after heating a growth furnace filled with high-purity silicon melt at a high temperature in a chamber to melt the raw material.

A factor affecting the quality of the silicon single crystal ingot grown by the Czochralski method is V/G, which is a ratio of a pulling speed (V) and a temperature gradient (G) at a solid-liquid interface. Therefore, it is important to control V/G in the entire period of growing the silicon single crystal ingot.

For this reason, an automatic growth controller (AGC) may be used to control the pulling speed of the silicon single crystal ingot. The AGC receives a current pulling speed, compares a set pulling speed with the received current pulling speed, and then sends a feedback control operation by appropriate control logic. A signal of the control operation is combined with a trajectory signal of a target temperature so as to adjust a set point value to be transmitted to an automatic temperature controller (ATC), thereby allowing the set point value to follow the set target trajectory. In addition, since the pulling speed is assigned as an operation variable of an automatic diameter controller (ADC) that controls the diameter of the silicon single crystal ingot, the pulling speed may be adjusted by the AGC operation in a long period while showing short-period fluctuations by the ADC control operation.

FIGS. 1A to 1C each illustrates a shape of a silicon single crystal ingot in a corresponding crystal orientation.

Referring to FIGS. 1A to 1C, four nodes may be formed on a surface of a body in a (100) crystal, two nodes and four fine facets may be formed on a surface of a body in a (110) crystal, and three facets may be formed on a surface of a body in a (111) crystal. Here, a length of the facet formed in the (111) crystal is greater than that of the facet formed in the (110) crystal. For example, the length of the facet formed in the (111) crystal may be 50 millimeters or more.

Since the silicon single crystal ingot having crystal orientation of (100) is not formed with a facet, the silicon single crystal ingot having crystal orientation of (100) may grow to a target diameter. However, since the silicon single crystal ingot having crystal orientation of (111) is formed with a facet, the silicon single crystal ingot having crystal orientation of (111) needs to grow larger than the target diameter in order to have a target effective diameter. Here, a problem may occur in that an edge of the silicon single crystal ingot other than the facet should be removed by grinding after growth.

In addition, when the facet enters a surface illuminated by the ADC while the silicon single crystal ingot having crystal orientation of (111) is growing, it is determined that the diameter of the ingot is momentarily decreased. Then, the diameter of the ingot determined to be decreased may be transmitted to the AGC and ATC logic, which may cause an error in the pulling speed of the silicon single crystal ingot.

The above-described error causes a problem in that the diameter of the growing silicon single crystal ingot is varied and a body region thereof may be reduced, thereby reducing the manufacturing yield of the silicon single crystal ingot.

SUMMARY OF THE INVENTION

Accordingly, the present invention is directed to a method and an apparatus for growing a silicon single crystal ingot that substantially obviate one or more problems due to limitations and disadvantages of the related art.

An object of the present invention is to provide a method and an apparatus for growing an ingot to have a sufficient diameter in manufacturing a wafer by controlling a length of a facet, particularly while growing a silicon single crystal ingot having crystal orientation of (111).

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a method of growing a silicon single crystal ingot, the method including growing a silicon single crystal ingot having crystal orientation of (111) using the Czochralski method, measuring a diameter of the silicon single crystal ingot, calculating a length of a facet of the silicon single crystal ingot, calculating a correction formula for a rotation speed of a seed and a correction formula for a pulling speed of the silicon single crystal ingot based on the calculated facet length, and correcting the rotation speed of the seed and the pulling speed of the silicon single crystal ingot based on a result of the calculation.

In the calculating the length of the facet of the silicon single crystal ingot, a change in the diameter of the silicon single crystal ingot caused by the rotation of the seed may be measured at regular intervals by using an automatic diameter control (ADC) sensor.

A facet length S1 is calculated by a formula of $S1=2R \times \sin(3B)$. Here, B rpm (revolutions per minute) denotes a rotation speed of the seed and R denotes the diameter of the silicon single crystal ingot. The ADC sensor may measure the change in diameter of the silicon single crystal ingot ten times per second.

When an absolute value of a difference between the calculated facet length S1 and a preset facet length S0 exceeds 5 mm, at least one of the rotation speed of the seed and the pulling speed of the silicon single crystal ingot may be corrected.

When an absolute value of a difference between the calculated facet length S1 and a preset facet length S0 is 5 mm or less, the rotation speed of the seed and the pulling speed of the silicon single crystal ingot may be maintained without change.

When the calculated facet length S1 is greater than the preset facet length S0, the rotation speed of the seed may be reduced by a value obtained by multiplying a value of S1−S0 by a first correction factor.

When the calculated facet length S1 is smaller than the preset facet length S0, the rotation speed of the seed may be increased by a value obtained by multiplying a value of S1−S0 by a first correction factor.

When the calculated facet length S1 is greater than the preset facet length S0, the pulling speed of the silicon single crystal ingot may be reduced by a value obtained by multiplying a value of S1−S0 by a second correction factor.

When the calculated facet length S1 is smaller than the preset facet length S0, the pulling speed of the silicon single crystal ingot may be increased by a value obtained by multiplying a value of S1−S0 by a second correction factor.

The preset facet length S0 may be 10% to 30% of the diameter R of the silicon single crystal ingot.

In another aspect of the present invention, an apparatus for growing a silicon single crystal ingot, the apparatus includes a chamber, a crucible placed in the chamber and containing a silicon melt therein, a heater placed in the chamber and around the crucible, a water cooling tube fixed at an inner upper portion of the chamber and disposed around a silicon single crystal ingot grown to be pulled up from the crucible, a heat shield provided at an upper portion of the crucible, an automatic diameter control (ADC) sensor configured to measure a diameter of a silicon single crystal ingot having crystal orientation of (111), the silicon single crystal ingot being grown and pulled up from the silicon melt, and a controller configured to calculate a length of a facet of the silicon single crystal ingot based on the diameter measured by the ADC sensor so as to perform the above described methods.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Hereinafter, embodiments of the present invention will be described in detail with reference to the accompanying drawings.

The embodiments of the present invention may be modified into various forms, and the scope of the present invention should not be construed as being limited to the following embodiments. These embodiments are provided so that this disclosure will be thorough and complete, and will fully convey the scope of the disclosure to those skilled in the art.

In addition, relative terms such as, for example, "first", "second", "on"/"upper"/"above", and "beneath"/"lower"/"below", used in the following description may be used to distinguish any one substance or element from another substance or element without requiring or containing any physical or logical relationship or sequence between these substances or elements.

Figure 1A:
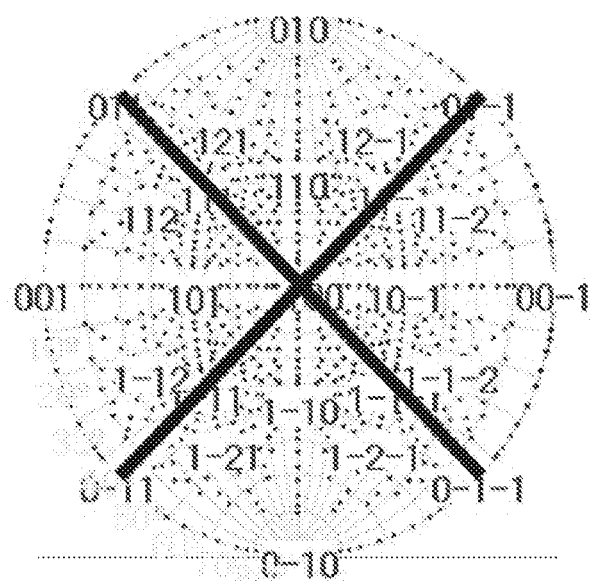
FIGS. 1A to 1C each illustrates a shape of a silicon single crystal ingot in a corresponding crystal orientation.
Figure 1B:
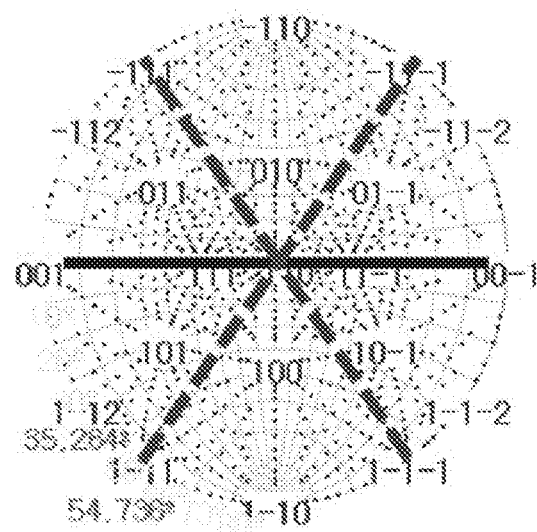
Figure 1C:
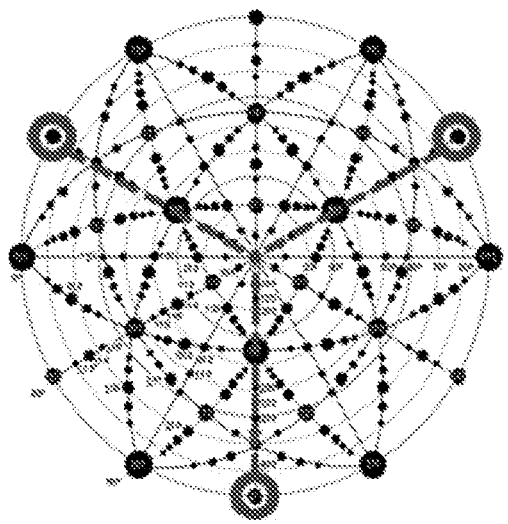
Figure 2:
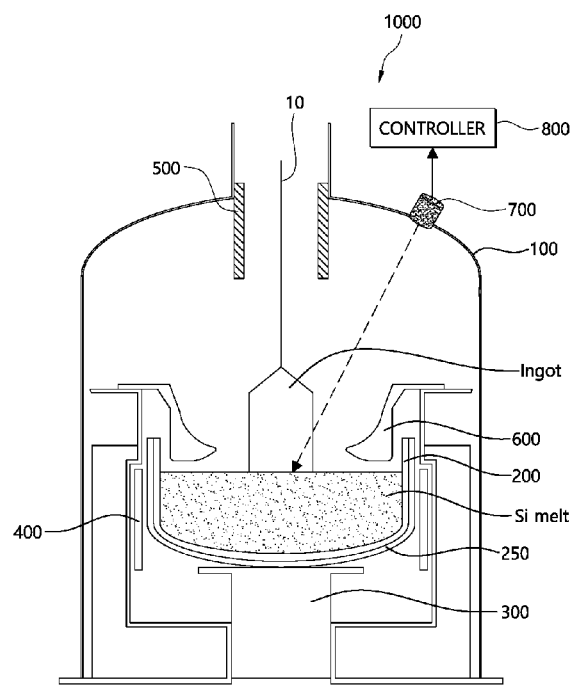
FIG. 2 illustrates an embodiment of an apparatus for growing a silicon single crystal ingot.

FIG. 2 illustrates an embodiment of an apparatus for growing a silicon single crystal ingot.

An apparatus 1000 for growing a silicon single crystal ingot according to this embodiment may include a chamber 100 in which a space is formed to grow a silicon single crystal ingot from a silicon melt (Si melt), crucibles 200 and 250 configured to contain the silicon melt therein, a heater 400 configured to heat the crucibles 200 and 250, a crucible rotating unit 300 configured to rotate and elevate the crucibles 200 and 250, a heat shield 600 positioned above the crucibles 200 and 250 to block the heat of the heater 400 toward the silicon single crystal ingot, and a water cooling tube 500 provided in an inner upper portion of the chamber 100 and configured to cool the high temperature silicon single crystal while the high temperature silicon single crystal is being pulled up, a noble gas supply unit (not illustrated) configured to supply a noble gas to an inner region of the chamber 100, an automatic diameter control (ADC) sensor 700 configured to measure a diameter of the silicon single crystal ingot that is grown and pulled up from the silicon melt, and a controller 800 configured to calculate a length of a facet of the silicon single crystal ingot based on the diameter measured by the ADC sensor 700, and to calculate a correction formula for a rotation speed of a seed 10 and a correction formula for a pulling speed of the silicon single crystal ingot based on the calculated facet length.

The chamber 100 provides a space where predetermined processes for forming the silicon single crystal ingot from the silicon melt (Si melt) are performed. Here, the silicon single crystal ingot being grown may have (111) crystal.

The crucibles 200 and 250 may be provided inside the chamber 100 so as to contain the silicon melt therein. The crucibles 200 and 250 may include a first crucible 200 that is in direct contact with the silicon melt, and a second crucible 250 that surrounds and supports an outer surface of the first crucible 200. The first crucible 200 may be made of quartz, and the second crucible 250 may be made of graphite.

The second crucible 250 may be separated into two or four pieces in preparation for the first crucible 200 to be expanded by heat. For example, when the second crucible 250 is separated into two pieces, a gap is formed between the two, so that even if the first crucible 200 inside the second crucible 250 is expanded, the second crucible 250 may not be damaged.

An insulating material may be provided in the chamber 100 so as to prevent the heat of the heater 400 from being discharged. In this embodiment, only the heat shield 600 above the crucibles 200 and 250 is shown, but insulating materials may be disposed at a side of the crucibles 200 and 250 and under the crucibles 200 and 250, respectively.

The heater 400 may melt polycrystalline silicon supplied in the crucibles 200 and 250 to make a silicon melt (Si melt), and current may be supplied from a current supply load (not illustrated) disposed above the heater 400.

A magnetic field generating unit (not illustrated) provided outside the chamber 100 may apply a horizontal magnetic field to the crucibles 200 and 250.

The crucible rotating unit 300 disposed at a center of a bottom surface of the crucibles 200 and 250 may support the crucibles 200 and 250 and elevate or rotate the crucibles 200 and 250. The seed (not illustrated) suspended from a seed chuck 10 above the crucibles 200 and 250 may be dipped in the silicon melt (Si melt), and the silicon single crystal ingot may be grown as the silicon melt is solidified from the seed.

During the process of growing the silicon single crystal ingot, a noble gas, for example, argon (Ar) may be supplied to the inside of the chamber 100. In this embodiment, argon may be supplied from the noble gas supply unit (not illustrated).

The chamber 100 may be partially opened in the illustrated area, and the ADC sensor 700 may be provided in the open area. The ADC sensor 700 may measure the diameter of the silicon single crystal ingot, for example, the ADC sensor 700 may measure the diameter of the silicon single crystal ingot grown at the interface with the silicon melt (Si melt).

A result from the above-described measurement may be transmitted to the controller 800. Then, the controller 800 may calculate the correction formula for the rotation speed of the seed 10 and the correction formula for the pulling speed of the silicon single crystal ingot. How the controller 800 performs such calculations may be described later.

Figure 3:
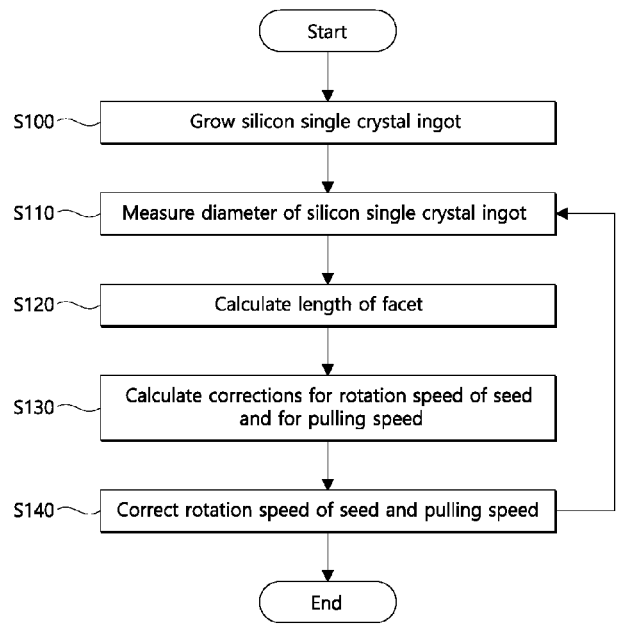
FIG. 3 shows an embodiment of a method of growing a silicon single crystal ingot.

FIG. 3 shows an embodiment of a method of growing a silicon single crystal ingot. The method according to this embodiment is a method of growing a silicon single crystal ingot using the apparatus of FIG. 2, and correcting a rotation speed of a seed and a pulling speed of the silicon single crystal ingot so as to control a length of a facet.

First, a silicon single crystal ingot having crystal orientation of (111) may be grown using the Czochralski method in step S100. The single crystal ingot may be grown by dipping a seed in a silicon melt, growing a shoulder and a body from a neck, and finally growing a tail.

Measuring the diameter of the single crystal ingot, measuring the length of the facet, and correcting the rotation speed of the seed and the pulling speed of the ingot, which will be described later, may be performed while growing the body of the silicon single crystal ingot.

After measuring the diameter of the silicon single crystal ingot using the ADC sensor in step S110, the length of the facet of the silicon single crystal ingot may be measured in step S120. Here, the length of the facet of the silicon single crystal ingot may be obtained by calculating the diameter measured by the ADC sensor as described below, and changes in the diameter of the silicon single crystal ingot due to the rotation of the seed may be measured at regular intervals using the ADC sensor.

Figure 4:
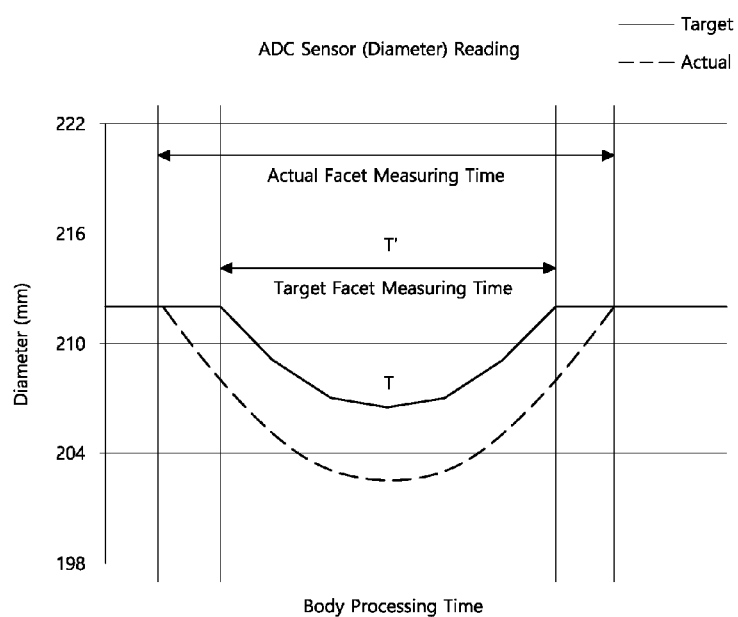
FIG. 4 shows a measurement result on a facet using an ADC sensor.

FIG. 4 shows the measurement result on the facet using the ADC sensor. For example, growth of a silicon single crystal ingot to manufacture a wafer with a radius of 200 mm is shown.

When the diameter of the silicon single crystal ingot having crystal orientation of (111) is read using the ADC sensor while growing the silicon single crystal ingot, it can be read that the diameter is relatively more decreased in a facet region. In FIG. 4, T denotes a target facet measuring time. When a length of an actual facet is longer than that of the target facet, a diameter of the actual facet is smaller than that of the target facet and an actual facet measuring Time T' is further increased.

Figure 5:
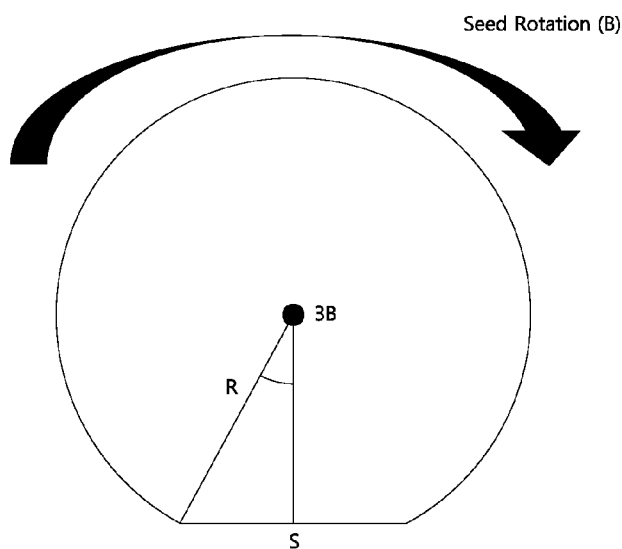
FIG. 5 shows a process of obtaining a length of a facet.

FIG. 5 shows a process of obtaining the length of the facet. FIG. 5 is a view showing a rotating ingot cut in a horizontal direction.

For example, when the ADC sensor reads data on the facet region of the silicon single crystal ingot ten times per second and the rotation speed of the seed is B rpm (revolutions per minute), the diameter of the ingot may be 2R (mm), the length of the facet may be S (mm), and the rotation angle of the ingot per a predetermined time may be 6B (°/sec) in FIG. 5.

Here, a formula of $\sin(3B)=S/2B$ is derived from the law of sines, thereby deriving a formula of $S=2R\times\sin(3B)$.

A value of the above-described facet obtained by the value measured by the ADC sensor and the calculation of the controller may be S1. Here, when the length of the facet is too large, a wafer cannot be actually manufactured in a body region of the silicon single crystal ingot, so it is necessary to adjust the length of the facet not to become too large.

In addition, when reducing the rotation speed of the seed or reducing the pulling speed of the ingot, the length of the facet may be shortened. Therefore, in order not to increase the length of the facet too much, the following correction may be performed.

A process in step S130 of calculating a correction formula for the rotation speed of the seed and a correction formula for the pulling speed of the silicon single crystal ingot based on the length of the facet obtained through measurement and calculation is as follows.

When a value of a difference between the above described calculated facet length S1 and a preset facet length S0 exceeds a predetermined range, at least one of the rotation speed of the seed and the pulling speed of the silicon single crystal ingot may be corrected.

For example, when the predetermined range is 5 mm and an absolute value of the difference between the calculated facet length S1 and the preset facet length S0 exceeds 5 mm, at least one of the rotation speed of the seed and the pulling speed of the silicon single crystal ingot may be corrected. On the other hand, when the absolute value of the difference between the calculated facet length S1 and the preset facet length S0 is 5 mm or less, the rotation speed of the seed and the pulling speed of the silicon single crystal ingot may be maintained without change.

Here, the preset facet length S0 may be 10% to 30% of the diameter R of the silicon single crystal ingot. In the case of the silicon single crystal ingot having crystal orientation of (111), the S0 may be 10% or more of the diameter R of the silicon single crystal. When the S0 exceeds 30% of the R, the diameter of the body of the grown ingot becomes too small, thereby making it difficult to manufacture a wafer of a required size after the process such as grinding. When the S0 exceeds 10% of the R, the single crystal having crystal orientation of (111) may not be properly grown and the silicon single crystal may be broken.

Hereinafter, a method of correcting the rotation speed of the seed and the pulling speed of the silicon single crystal ingot will be described in detail. First, the method of correcting the rotation speed of the seed will be described as an example.

When the calculated facet length S1 is greater than the preset facet length S0, the rotation speed of the seed may be reduced by a value obtained by multiplying a value of S1−S0 by a first correction factor. When the calculated facet length S1 is smaller than the preset facet length S0, the rotation speed of the seed may be increased by the value obtained by multiplying the value of S1−S0 by the first correction factor.

Here, the first correction factor may be, for example, 0.1, and the rotation speed of the seed may be changed by 0.2 rpm, but is not limited thereto.

Hereinafter the method of correcting the pulling speed of the ingot will be described as an example.

When the calculated facet length S1 is greater than the preset facet length S0, the pulling speed of the silicon single crystal ingot may be reduced by a value obtained by multiplying a value of S1−S0 by a second correction factor. When the calculated facet length S1 is smaller than the preset facet length S0, the pulling speed of the silicon single crystal ingot may be increased by the value obtained by multiplying the value of S1−S0 by the second correction factor.

Here, the second correction factor may be, for example, 0.0003, and the pulling speed of the ingot may be changed by 0.001 mm/min, but is not limited thereto.

Then, based on the above-described calculation result, the rotation speed of the seed and the pulling speed of the silicon single crystal ingot are corrected in step S140, so that the length of the facet in the body region of the silicon single crystal ingot does not become too large.

Figure 6:
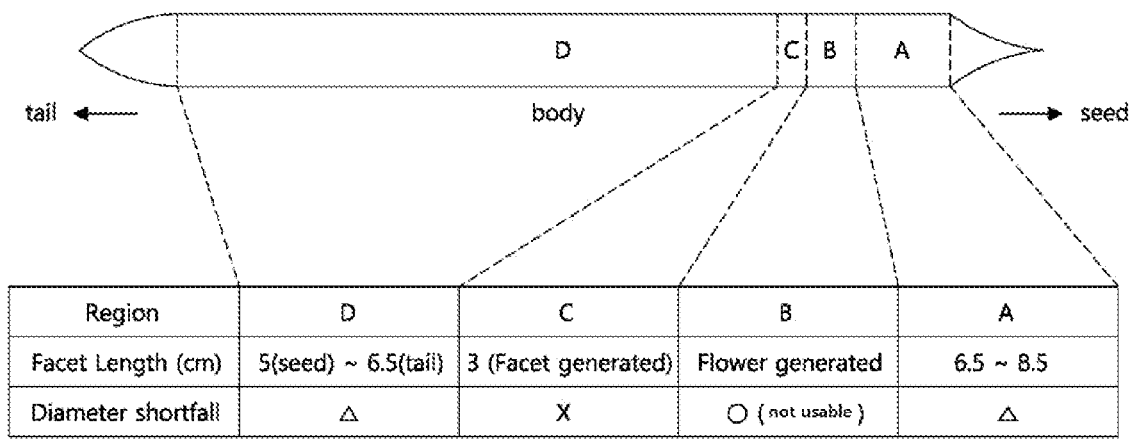
FIG. 6 shows a shape in a longitudinal direction of a silicon single crystal ingot grown by the apparatus of FIG. 2 and by the method of FIG. 3.

FIG. 6 shows a shape in a longitudinal direction of the silicon single crystal ingot grown by the apparatus of FIG. 2 and by the method of FIG. 3.

From a direction from the seed to the tail, the body of the silicon single crystal ingot having crystal orientation of (111) may be divided into A, B, C, and D, and the length of the facet in each of the regions A to D is as shown in FIG. 6.

In the region B, a flower may be generated, that is, the diameter in this region may be uneven and not uniform. This may allow the diameter to remain smaller than the diameter of the wafer after the grinding process, thereby making it difficult to manufacture the wafer.

In the regions A and D, the length of the facet may be 5 to 6.5 centimeters (cm), whereby there may be a portion smaller than the diameter of the wafer after grinding. Therefore, there is a great need to perform correction of the seed rotation and the pulling speed of the ingot in the above-described method.

In the region C, the length of the facet is about 3 cm, and there may be no portion smaller than the diameter of the wafer after grinding.

In the method and the apparatus for growing a silicon single crystal ingot according to the embodiment, the length of the facet is measured while growing the body of the silicon single crystal ingot having crystal orientation of (111), so that the rotation speed of the seed and the pulling speed of the ingot are adjusted when the length of the facet is too short or too long. Therefore, the silicon single crystal ingot can be grown to a diameter sufficient for manufacturing a wafer without being damaged.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of growing a silicon single crystal ingot, the method comprising:

growing a silicon single crystal ingot having crystal orientation of (111) using Czochralski method;

determining a diameter of the silicon single crystal ingot;

calculating a length of a facet of the silicon single crystal ingot;

determining a correction for a rotation speed of a seed or a pulling speed of the silicon single crystal ingot based on the calculated facet length; and correcting the rotation speed of the seed or the pulling speed of the silicon single crystal ingot based on the determined correction, wherein, in the calculating the length of the facet, a change in the diameter of the silicon single crystal ingot caused by the rotation of the seed is measured by an automatic diameter control (ADC) sensor at intervals of ten times per second, wherein the calculating of the length of the facet includes calculating a facet length S1 by a formula of $S1=2R \times \sin(3B)$, where B rpm (revolutions per minute) denotes a rotation speed of the seed and R denotes the diameter of the silicon single crystal ingot, wherein the determining of the correction includes determining of the correction of at least one of the rotation speed of the seed and the pulling speed of the silicon single crystal ingot when an absolute value of a difference between the calculated facet length S1 and a preset facet length S0 exceeds 5 mm, and wherein the determining the correction of the rotation speed of the seed includes:

when the calculated facet length Si is greater than the preset facet length S0, determining the rotation speed of the seed to be reduced by a value obtained by multiplying a value of S1−S0 by a first correction factor, and when the calculated facet length S1 is smaller than the preset facet length S0, determining the rotation speed of the seed to be increased by the value obtained by multiplying the value of S1−S0 by the first correction factor.

2. The method according to claim 1, wherein the determining the correction of the pulling speed of the silicon single crystal ingot includes:

when the calculated facet length S1 is greater than the preset facet length S0, determining the pulling speed of the silicon single crystal ingot to be reduced by a value obtained by multiplying a value of S1−S0 by a second correction factor, and when the calculated facet length S1 is smaller than the preset facet length S0, determining the pulling speed of the silicon single crystal ingot to be increased by the value obtained by multiplying the value of S1−S0 by the second correction factor.

3. A method of growing a silicon single crystal ingot, the method comprising:

growing a silicon single crystal ingot having crystal orientation of (111) using Czochralski method;

determining a diameter of the silicon single crystal ingot;

calculating a length of a facet of the silicon single crystal ingot; and determining whether to perform correction for a rotation speed of a seed or a pulling speed of the silicon single crystal ingot based on the calculated facet length;

wherein, in the calculating the length of the facet of the silicon single crystal ingot, a change in the diameter of the silicon single crystal ingot caused by the rotation of the seed is measured by an automatic diameter control (ADC) sensor at intervals of ten times per second, wherein the calculating of the length of the facet includes calculating a facet length S1 by a formula of S1=2R×sin(3B), where B rpm (revolutions per minute) denotes a rotation speed of the seed and R denotes the diameter of the silicon single crystal ingot, and wherein, when an absolute value of a difference between the calculated facet length S1 and a preset facet length S0 is 5 mm or less, the rotation speed of the seed and the pulling speed of the silicon single crystal ingot are determined to be maintained without change.

4. The method according to claim 3, wherein the preset facet length S0 is 10% to 30% of the diameter R of the silicon single crystal ingot.

5. A method of growing a silicon single crystal ingot, the method comprising:

growing a silicon single crystal ingot having crystal orientation of (111) using Czochralski method;

determining a diameter of the silicon single crystal ingot;

calculating a length of a facet of the silicon single crystal ingot;

determining a correction for a rotation speed of a seed or a pulling speed of the silicon single crystal ingot based on the calculated facet length; and correcting the rotation speed of the seed or the pulling speed of the silicon single crystal ingot based on the determined correction, wherein, in the calculating the length of the facet, a change in the diameter of the silicon single crystal ingot caused by the rotation of the seed is measured by an automatic diameter control (ADC) sensor at intervals of ten times per second, wherein the calculating of the length of the facet includes calculating a facet length S1 by a formula of S1=2R×sin(3B), where B rpm (revolutions per minute) denotes a rotation speed of the seed and R denotes the diameter of the silicon single crystal ingot, wherein the determining the correction includes determining of the correction of at least one of the rotation speed of the seed and the pulling speed of the silicon single crystal ingot when an absolute value of a difference between the calculated facet length S1 and a preset facet length S0 exceeds 5 mm, and wherein the determining the correction of the pulling speed of the silicon single crystal ingot includes:

when the calculated facet length S1 is greater than the preset facet length S0, determining the pulling speed of the silicon single crystal ingot to be reduced by a value obtained by multiplying a value of S1−S0 by a second correction factor, and when the calculated facet length S1 is smaller than the preset facet length S0, determining the pulling speed of the silicon single crystal ingot to be increased by the value obtained by multiplying the value of S1−S0 by the second correction factor.

6. The method according to claim 5, wherein the determining the correction of the rotation speed of the seed includes:

when the calculated facet length Si is greater than the preset facet length S0, determining the rotation speed of the seed to be reduced by a value obtained by multiplying the value of S1−S0 by a first correction factor, and when the calculated facet length S1 is smaller than the preset facet length S0, determining the rotation speed of the seed to be increased by the value obtained by multiplying the value of S1−S0 by the first correction factor.

* * * * *